US007840918B1

(12) United States Patent
Duthou

(10) Patent No.: US 7,840,918 B1
(45) Date of Patent: Nov. 23, 2010

(54) METHOD AND APPARATUS FOR PHYSICAL IMPLEMENTATION OF A POWER OPTIMIZED CIRCUIT DESIGN

(75) Inventor: Arnaud Duthou, Grenoble (FR)

(73) Assignee: Xilinx, Inc., San Jose, CA (US)

( * ) Notice: Subject to any disclaimer, the term of this patent is extended or adjusted under 35 U.S.C. 154(b) by 396 days.

(21) Appl. No.: 11/903,465

(22) Filed: Sep. 21, 2007

(51) Int. Cl.
*G06F 17/50* (2006.01)
*H03K 17/693* (2006.01)

(52) U.S. Cl. ............... 716/2; 716/1; 716/4; 716/5; 716/6; 716/16; 716/17; 716/18

(58) Field of Classification Search ............ 716/1, 716/2, 16–18; 713/176, 320
See application file for complete search history.

(56) References Cited

U.S. PATENT DOCUMENTS

| 6,810,482 | B1 * | 10/2004 | Saxena et al. ............... 713/320 |
| 7,500,216 | B1 * | 3/2009 | Blunno et al. ............... 716/18 |
| 7,555,741 | B1 * | 6/2009 | Milton et al. ............... 716/16 |
| 7,587,620 | B1 * | 9/2009 | Egier et al. ............... 713/320 |
| 2007/0220263 | A1 * | 9/2007 | Ziener et al. ............... 713/176 |

OTHER PUBLICATIONS

Kim et al.; "Logic transformation for low power synthesis"; Publication Year: 1999; Design, Automation and Test in Europe Conference and Exhibition 1999. Proceedings; pp. 158-162.*
U.S. Appl. No. 11/494,642, Duthou A. et al., entitled "Method and Apparatus for Directed Physical Implementation of a Circuit Design for an Integrated Circuit", filed Jul. 27, 2006, 24 pages, Xilinx, Inc. 2100 Logic Drive, San Jose, California.

* cited by examiner

*Primary Examiner*—Helen Rossoshek
(74) *Attorney, Agent, or Firm*—LeRoy D. Maunu; Lois D. Cartier

(57) ABSTRACT

In a method of optimizing power consumption in an integrated circuit, a physically implemented circuit design meeting at least one timing constraint is provided. A design block of the physically implemented circuit design having a high toggle rate pattern is identified. A power optimized transformation type of numerous power optimized transformation types is selected. The power optimized transformation type is applied to the design block of the physically implemented circuit design. A modified physically implemented circuit design is generated, where the modified physically implemented circuit design is power optimized.

8 Claims, 7 Drawing Sheets

METHOD AND APPARATUS FOR PHYSICAL IMPLEMENTATION OF A POWER OPTIMIZED CIRCUIT DESIGN

FIELD OF THE INVENTION

One or more aspects of the present invention relate generally to computer aided design of integrated circuits (ICs), and more particularly to a method and apparatus for physical implementation of a circuit design for an IC.

BACKGROUND

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by programmable input/output blocks (IOBs). The CLBs and IOBs are interconnected by a programmable interconnect structure. An FPGA may also include various dedicated logic circuits, such as memories, digital clock managers (DCMs), and input/output (I/O) transceivers. An FPGA may include one or more embedded processors. The programmable logic of an FPGA (e.g., CLBs, IOBs, and interconnect structure) is typically programmed by loading a stream of configuration data (known as a bitstream) into internal configuration memory cells. The states of the configuration memory cells define how the CLBs, IOBs, interconnect structure, and other programmable logic are configured. Some FPGAs include support for run-time partial reconfiguration, which provides the ability to alter the behavior of portions of a circuit configured in an active FPGA. Partial reconfiguration is useful in systems that must support a wide range of optional behavior, such as performance optimization, only a subset of which is operational at any point in time.

To implement a circuit design using an FPGA, the design is synthesized and mapped onto programmable logic blocks, placed within the FPGA, and routed using the programmable fabric. The place and route phases of implementing a circuit design engage generating a layout of the circuit elements on the FPGA and defining the routing resources that connect the elements. In some instances, it may be necessary to modify a design after the design is physically implemented in order to meet a particular design criteria. In an example, the design criteria may be reduced power consumption and/or performance optimization. Current methods for implementing design changes such as power optimization are inefficient in terms of CPU runtime and/or in the quality of the results. For example, after making a change to a design, a designer may have to completely re-implement the physical design from scratch. Such a technique, however, is not runtime efficient. Alternatively, a designer may employ strict guiding methods that may improve runtime, but often provides results of poor quality that does not meet the overall design goal. Accordingly, there exists a need in the art for an improved method and apparatus for implementing a modified version of a previously implemented circuit design.

SUMMARY

Method, apparatus, and computer readable medium for physical implementation of a circuit design for an integrated circuit (IC) is described. Embodiments of the present invention relate to a power optimized physical implementation of circuit design. A physically implemented circuit design meeting a timing constraint is provided. A design block of the physically implemented circuit design having a high toggle rate pattern is identified. A power optimized transformation type of a plurality of power optimized transformation types is selected. The power optimized transformation type is applied to the design block of the physically implemented circuit design having the high toggle rate pattern. A modified physically implemented circuit design is generated, where the modified physically implemented circuit design is power optimized.

BRIEF DESCRIPTION OF THE DRAWINGS

One or more aspects of the present invention is illustrated by way of example, and not by way of limitation, in the following figures. The accompanying drawing(s) should not be taken to limit the invention to the embodiment(s) shown, but are for explanation and understanding only.

DETAILED DESCRIPTION OF THE DRAWINGS

While the specification concludes with claims defining some features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and/or functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention. In other instances, well-known circuits and devices may be omitted or presented in an abstract form in order to avoid obscuring the present invention.

Figure 1:
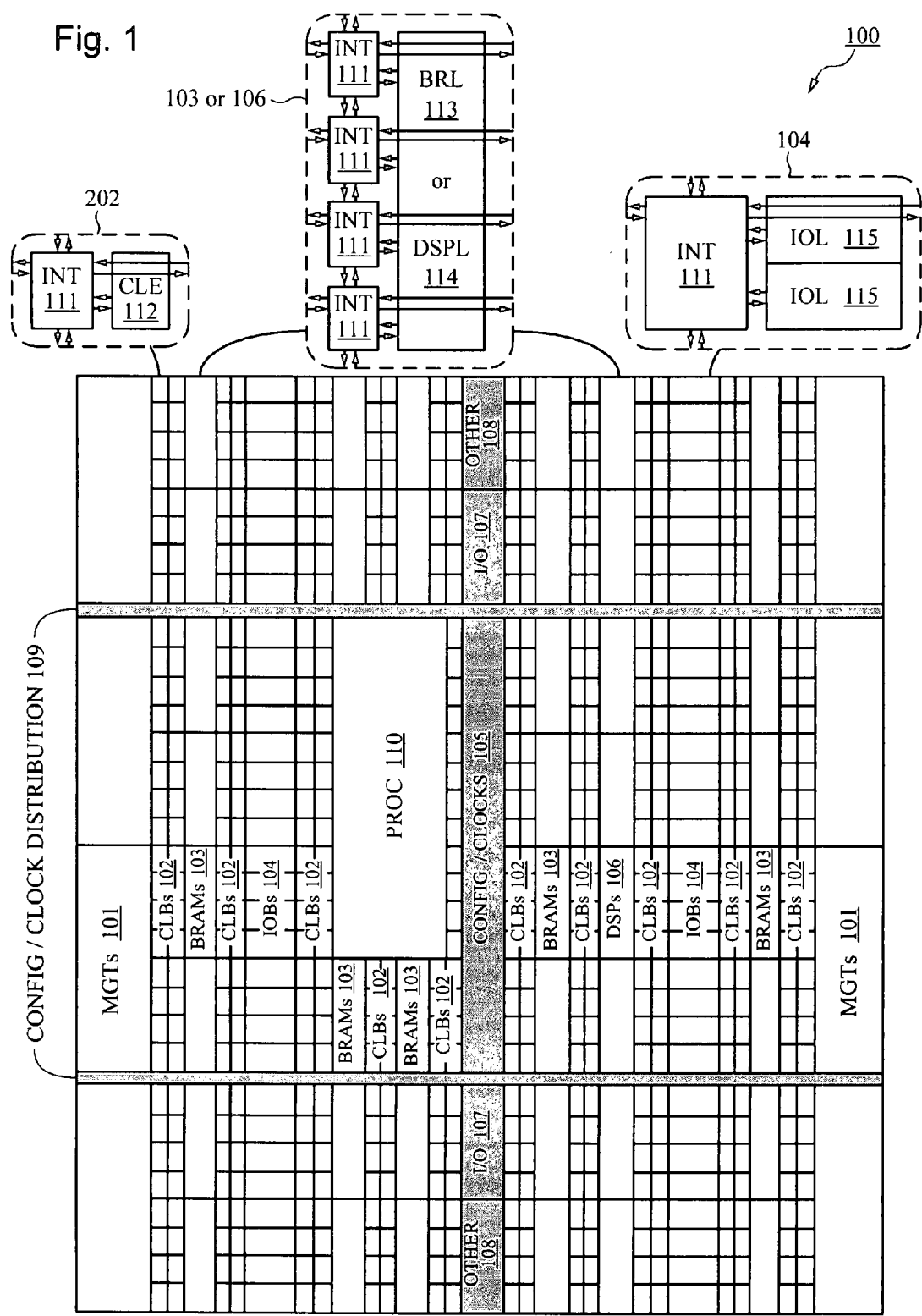
FIG. 1 illustrates an exemplary programmable logic device (PLD) architecture.

FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth.

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

The FPGA architecture 100 also includes one or more dedicated processor blocks (PROC 110). The processor block 110 comprises a microprocessor core, as well as associated control logic. Such a microprocessor core may include embedded hardware or embedded firmware or a combination thereof for a "hard" or "soft" microprocessor. A soft microprocessor may be implemented using the programmable logic (e.g., CLBs, IOBs). For example, a soft microprocessor (e.g., MicroBlaze), available from Xilinx, Inc. of San Jose, Calif., may be employed. A hard microprocessor may be implemented, such as the Intel® Core™2 Duo processor, the AMD Athlon™ 64 X2 Dual-Core processor, the IBM PowerPC processor, or like type processor core known in the art. The processor block 110 is coupled to the programmable logic of the FPGA in a well known manner.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Configuration information for the programmable logic is stored in configuration memory (not shown). The configuration logic 105 provides an interface to, and loads configuration data to, the configuration memory. A stream of configuration data ("configuration bitstream") may be coupled to the configuration logic 105, which in turn loads the configuration memory. The configuration logic 105 is configured to support the loading of partial configuration bitstreams while the FPGA is active. This allows for reconfiguration of portions of the FPGA during runtime. The configuration and reconfiguration process for the FPGA is well known in the art.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

Figure 2:
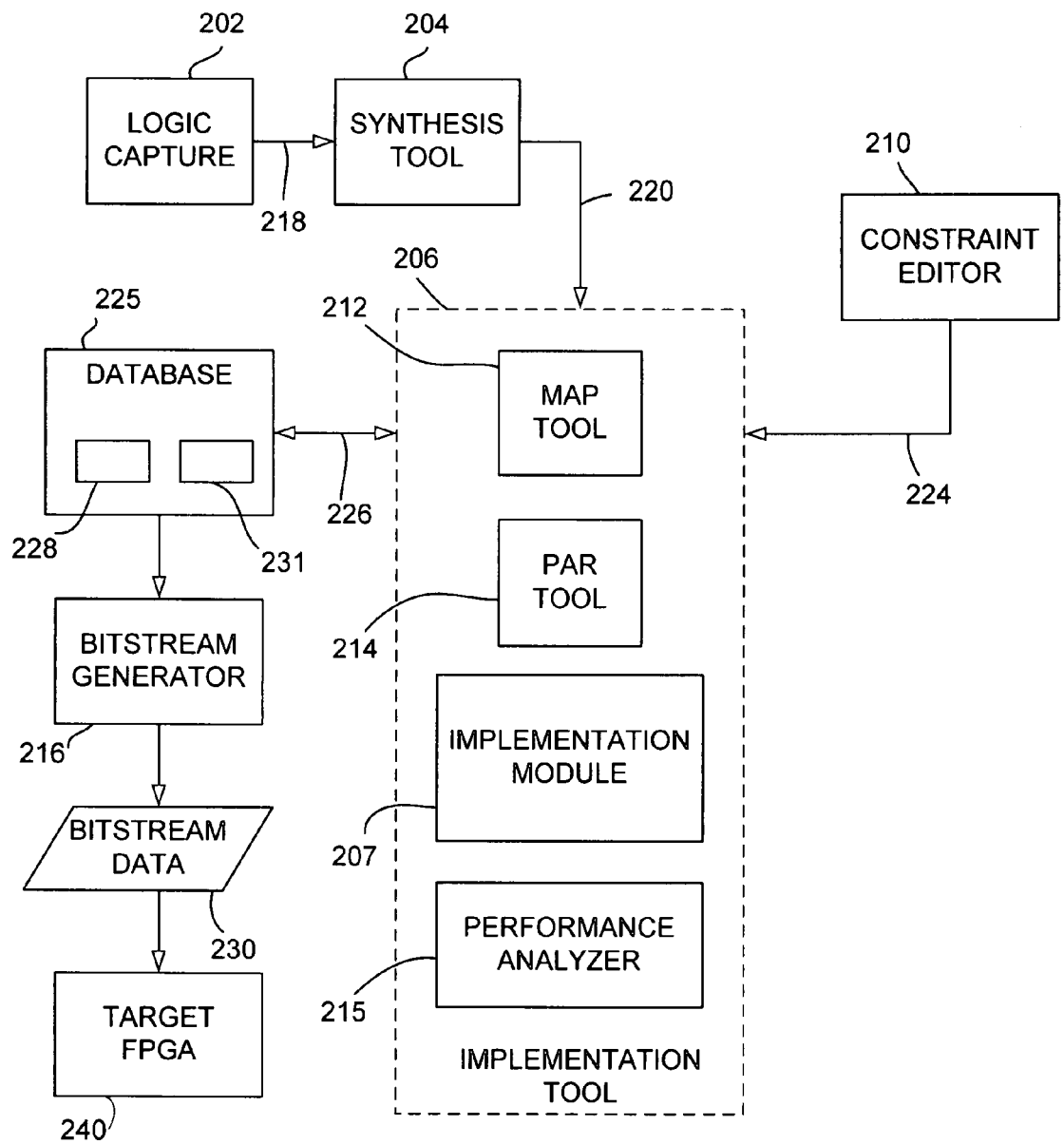
FIG. 2 is a block diagram illustrating a logic design system for providing a programmable logic device (PLD) according to an embodiment of the present invention.

FIG. 2 is a block diagram depicting an exemplary embodiment of a design system 200 for a programmable logic device (PLD) according to an embodiment of the present invention. One or more aspects of the invention relate to power optimized physical implementation of a circuit design or physically implemented circuit design for a targeted FPGA. The system 200 is configured to leverage results of an implementation of a previous version of the circuit design to generate a more power optimized implementation of the circuit design having the same function and an equivalent quality of result/performance. For purposes of clarity by example, the logic design system 200 is described immediately below with respect to a logic design in general. Features of the design system 200 specifically pertaining to physical implementation of a circuit design are described thereafter.

The system 200 includes a logic capture tool 202, a synthesis tool 204, a constraint editor 210, an implementation tool 206, and a bitstream generator 216. System 200 may be configured to provide a physically implemented circuit design for a targeted FPGA. Accordingly, the implementation tool 206 may include a map tool 212, a place-and-route (PAR) tool 214, and a performance analyzer tool 215. The system 200 may be implemented using the method steps illustrated in FIG. 3 or FIG. 4 (described below). The tools may be part of one or more software programs stored in a memory and configured for execution by a central processing unit (CPU).

In particular, the logic capture tool 202 is configured to capture a circuit design from a user and generate a behavioral description 218 of the circuit design. The behavioral description 218 includes a plurality of circuit components behavioral description, such as flip-flops, memories, gates, lookup tables (LUTs), and the like, connected together via signal conductors (nets). The logic capture tool 202 may include a graphic interface through which a designer connects symbols and blocks representing various components to produce a schematic description of the circuit design. The logic capture tool 202 may also include a text interface through which a designer writes hardware description language (HDL) code to produce a structural and/or behavioral description of the circuit design in terms of HDL constructs. Examples of HDLs include the Very high-speed integrated circuit Hardware Description Language (VHDL) and Verilog.

The synthesis tool 204 is configured to receive the behavioral description 218. The synthesis tool 204 processes the behavioral description 218 to produce a logical description 220 of the circuit design. The logical description 220 includes a logical network list ("netlist") of lower-level circuit elements and logic gates, as well as connections/routes between inputs and outputs thereof, in terms of the hierarchy specified in the behavioral description 218. For example, the logical description 220 may be compliant with the Electronic Design Interchange Format (EDIF). The synthesis tool 204 may also generate constraint data associated with the logical description 220 that includes various timing and layout constraints. Alternatively, the logical description 220 may be annotated with constraint data. Such an annotated netlist may be produced by a synthesis tool, such as the XST synthesis tool commercially available from Xilinx, Inc., of San Jose, Calif.

A designer may use the constraint editor 210 to produce constraint data 224 having various constraints, such as period constraints (e.g., the time between rising edges of a clock signal) for all clocks, as well as input/output (IO) timing constraints (time between two pins, typically measured from a clock input at a first pin and data out at a second pin) for IOs, power constraints (e.g., using a range of logic blocks including power saving features), and the like.

The implementation tool 206 is configured to receive the logical description 220 and the constraint data 224. The map tool 212 maps the logical description 220 onto physical resources within the targeted FPGA (i.e., the circuit components, logic gates, and signals are mapped onto LUTs, flip-flops, clock buffers, gates, I/O pads, and the like of the target FPGA). The implementation tool 206 produces a mapped circuit description 226 in accordance with any constraints, such as timing constraints, in the constraint data 224. In an example, a circuit design may have at least one timing constraint file. The mapped circuit description 226 includes groupings of the physical resources of the target FPGA 240 expressed in terms of CLBs and IOBs, and other physical resources on the FPGA 240.

The PAR tool 214 determines placement for the physical resource groupings of the mapped circuit description 226 in the targeted FPGA 240 and allocation of the appropriate routing resources. The PAR tool 214 performs such placement and routing in accordance with any constraints in the constraint data 224. The PAR tool 214 produces a physical design data (e.g., a placed and routed netlist), which is stored in a database 225. The bitstream generator 216 is configured to obtain physical design data from the database 225 and produce bitstream data 230 for the targeted FPGA 240. In general, a route is a physical connection between two or more nodes; we may also refer to the route as a net.

The performance analyzer tool 215 of the implementation tool 206 is configured to evaluate performance parameters of the physically implemented circuit design. Performance parameters may include timing analysis and/or power analysis on the physically implemented circuit design. Timing and power analysis may be performed after mapping, placing, and routing the design. The performance analyzer tool 215 in one instance is configured to report delays for particular paths and slack values based on specified timing requirements. Output of the performance analyzer tool 215 may be used to identify critical paths and/or power consumption of the design.

In one embodiment of the invention, the design system 200 is utilized to generate a first behavioral description of a circuit design and corresponding first physical design data. This first behavioral description is referred to as the "original version" of the circuit design, and the corresponding first physical design data is referred to as the "original" implementation of the circuit design or physically implemented circuit design. The original implementation comprises an original netlist 228 (the physically implemented circuit design), which has already been implemented (e.g., mapped, placed, and routed).

A second behavioral description is then produced, which represents a modified version of the circuit design (e.g., elements and/or connections in the circuit design may be removed, added, or otherwise modified from the original version). The implementation tool 206 is configured to receive an original version of a logical description (e.g., netlist). It is also configured to generate a modified version of the circuit design. For example, a power optimized version of the original circuit design. The modified version may include a modified netlist 231 (illustratively shown as being stored in the database 225). Initially, the modified netlist 231 is not implemented (i.e., is not placed and not routed). The implementation tool 206 generates the modified netlist 231 using physical implementation. The modified netlist 231 is generated based on a power optimization transformation type corresponding to a design block having a high toggle rate pattern. In an example, the implementation tool 206 may obtain the original netlist 228 from the database 225.

In particular, the implementation tool 206 may include an implementation module 207 for initiating and controlling the physical implementation of the circuit design. Those skilled in the art will appreciate that the functions performed by the implementation module 207 described below may be incorporated into the MAP tool 212 and/or PAR tool 214, rather than in a separate module as shown. The implementation module 207 may be configured in part to identify design blocks having high toggle rate patterns of the original version of the physically implemented circuit design 228. For example, an original version of a netlist (generated by the synthesis tool 204) may be evaluated and a design block of the netlist may be identified as having a high toggle rate pattern. The design block may be selected to be power optimized (i.e., reducing power consumption) by applying a power optimization transformation type. Choosing the power optimization transformation type may be based on comparing measured power results of between a physically implemented version of a circuit design and a modified version of the physically implemented version of the circuit design. In general, lower power consumption is desired. The implementation module 207 in one example may be configured to partially place and route the modified netlist 231 based on the original netlist 228. For some elements, such as design blocks not having high toggle rate patterns, placement is obtained from the original netlist 228 and copied to the modified netlist 231.

The modified netlist 231 as partially placed and routed is then passed to the PAR tool 214. In one instance, the PAR tool 214 does not have to perform as much work as for a netlist that has not been placed and/or routed. Therefore, runtime of the PAR tool 214 is decreased. In particular, the PAR tool 214 may use a design block placement from netlist 228, which may contribute to improved runtime and general performance, such as meeting timing and power consumption performance. The PAR tool 214 must place the new and/or modified elements in the modified netlist 231 to meet the applicable timing constraints. Thus, during the placement process, the PAR tool 214 obtains signal delays for routes between placed elements to identify timing critical connections. The criticality of a connection can be measured by the "slack" thereof. Slack is the difference between the time a signal is to arrive at a particular destination to meet established a design constraint and the actual time, or estimated time as determined by a design tool, at which the signal arrives. The more negative the slack, the more critical both the connection and the elements associated with that connection. Criticality is determined by comparing the slack values to a threshold value. If slack of a connection is greater than the threshold, then the element associated therewith is classified as being non-critical. Otherwise, the element is classified as being critical.

The PAR tool 214 is configured to generate an optimized placement for the modified netlist 231. In one embodiment, the PAR tool 214 uses actual timing characteristics associated with the physical placements during placement. The actual timing characteristics can be determined exactly, since the matching elements are completely placed and routed. Moreover, since the matching elements are in exactly the same configuration as in the original netlist 228, their timing characteristics in the modified netlist 231 will be the same or similar to their timing characteristics in the original netlist 228. Exemplary timing characteristics that can be determined include signal delays for the routes. The timing characteristics may be determined by the PAR tool 214 or by the performance analyzer 215. Typically, a PAR tool does not have routing information available for a netlist to compute the exact delays of connections. Thus, the PAR tool uses a delay estimator that provides estimated delays of connections between elements during placement. Accurate delay estimators are difficult to create, as they have to provide quantified results for diverse configurations in a limited amount of time (so as to not penalize runtime). The PAR tool 214, however, is configured to use actual delay information for routes that are completely implemented (as copied from the original version of the design 228). By using the actual delays for these routes, the PAR tool 214 guarantees exact measurements of the signal delays, which leads to higher quality results. Typically, a large number of signal delays will be actual signal delays for the physically implemented routes (the smaller the changes compared to the original design, the more physically implemented routes there are). The PAR tool 214 is able to generate a more efficient placement due use of the actual signal delays.

The PAR tool 214 also achieves routing using a similar mechanism. The modified netlist 231 may include physically implemented routes. Thus, the PAR tool 214 only has to operate on modified routes and/or element placements, which saves runtime of the routing process. In addition, the PAR tool 214 is generally aware of the available routing resources (i.e., those not used by the physically implemented routes), which limits the space of solution the PAR tool 214 must explore. The routing process also uses the actual signal delay information for the original physically implemented circuit design netlist 228 when determining timing criticality. Similar to the placement process, if a connection is too critical and cannot achieve timing and/or optimized power consumption with the current configuration, or if a physically implemented route uses resources necessary for another connection, the PAR tool 214 is configured to invalidate the physically implemented route. The PAR tool 214 then either re-routes this connection differently so that it meets timing requirements or free up some routing resources to route a more critical connection.

Using the actual timing characteristics for the routes copied from the original netlist 228, the implementation tool 206 will be able to apply a power optimized transformation type and generate a modified netlist (e.g., netlist 231) of the circuit design resulting in a desirable quality of result (e.g., a power optimized circuit design meeting timing constraint), while improving runtime.

Figure 3:
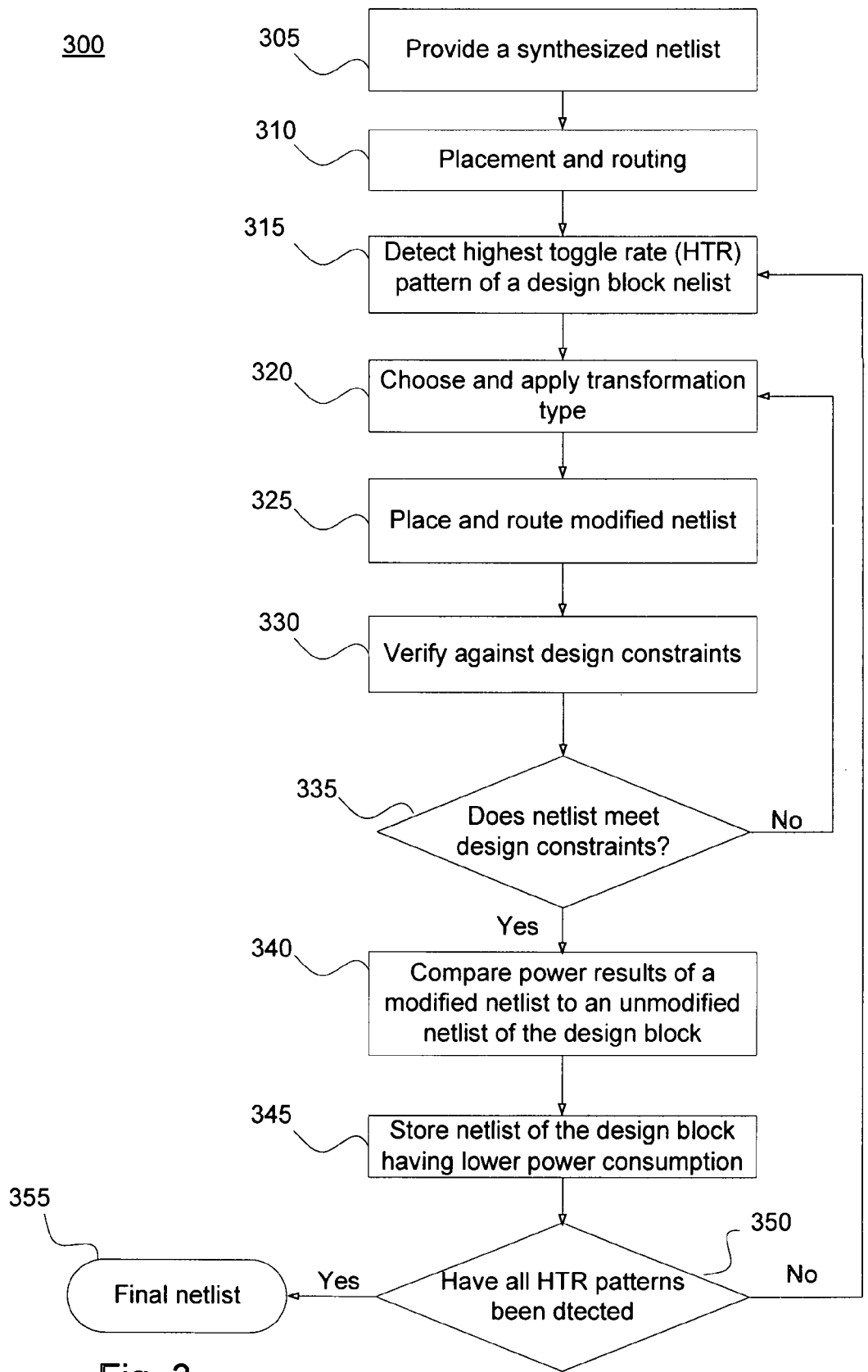
FIG. 3 is a flow diagram illustrating method steps for providing a physically implemented circuit design according to an embodiment of the present invention.

FIG. 3 is a flow diagram illustrating method steps for providing a physically implemented circuit design according to an embodiment of the present invention. FIG. 3 exemplifies a method for modifying a physically implemented circuit design netlist (e.g., netlist 228 of FIG. 2) and providing a modified version of the physically implemented circuit design netlist (e.g., netlist 231 of FIG. 2). The modified version of the physically implemented circuit design netlist meets a timing constraint and is optimized for power. The method begins at step 305, where a synthesized and physically mapped netlist is provided. For example, logical description 220 of FIG. 2 may represent a synthesized netlist (using synthesis tool 204). At step 310 the netlist provided by step 305 is placed and routed. For example, the synthesized logical description 220 may be placed and routed (by the PAR tool 214 of FIG. 2), where the physically implemented circuit design meets at least one timing constraint.

At step 315 a highest toggle rate (HTR) pattern of numerous HTR patterns is detected. For instance, the physically implemented circuit design netlist 228 of FIG. 2 may have numerous design blocks, where a design block of the numerous design block, may have HTR patterns. The HTR patterns may be detected in design blocks having high rate of switching activities on input and/or output terminals. At step 320 a transformation type is chosen. In one example, the transformation type may be a power optimization transformation type. In an example, numerous power optimization types may be available to choose from, but only one power optimization transformation type may be chosen and applied to the detected design block. At step 325 the modified design block is placed and routed, where the modification may include power optimization. For instance, the PAR tool 214 of FIG. 2 may be used to perform the placing and routing. In one example, the applied transformation type may only move a signal or a guided signal having HTR patterns or high switching activities. In another example, achieving power optimization may require rearranging design blocks or guided placements. For instance, an FPGA may include a circuit design having numerous LUT circuits coupled to perform a logic function. The circuit design is physically implemented to meet design performance criteria, but it is not optimized for power. For instance, rearranging LUT circuits (e.g., guided placements) may optimize the circuit design power performance while maintaining the design performance criteria. At step 325 a placed and routed physically implemented circuit design having an optimized power and meeting performance criteria may be provided.

At step 330 the modified and physically implemented circuit design is verified to meet the performance criteria. The performance criteria may include parameters such as timing constraints. For instance, the timing constraint used at step 330 is the same timing constraint that was provided for the original physically implemented circuit design. At step 335 if the modified circuit design meets the performance criteria, then the power results from the modified circuit design may be compared to power results of the circuit design detected in step 315 (step 340). Otherwise, If the modified circuit design does not meet the design constraint, then another transformation type is chosen and applied (step 320) to the circuit design detected in step 315. In one example, the actual measured power results are used to compare the modified version of the circuit design to a previous version of the circuit design. At step 345 the netlist belonging to the physically implemented circuit design with the least power consumption may be stored. In one example, the original physically implemented circuit design may be used to implement the final design. The above statement may be true if the original physically implemented circuit design consumes the least amount of power while meeting the design constraint.

At step 350, the method checks if all the HTR patterns associated with a circuit design have been detected. If an additional HTR pattern has not been optimized, then go to step 315 and repeat the process described above. The above steps (step 315-step 350) may repeat pending the detection of all design blocks having HTR patterns and applying the proper transformation type to each one of the detected design blocks. The method of FIG. 3 may conclude at step 355 when all the HTR patterns have been detected (step 350) and a modified version of the design blocks or circuit designs are placed, routed, and verified to meet the performance criteria. At step 355, we may have a modified physically implemented circuit design meeting constraints and optimized for power. In an example, optimizing a physically implemented circuit design having numerous HTR patterns may not be applicable. By applying the numerous transformation types to the circuit design may fail the verification to meet a performance criterion. In such instances, the original circuit design may be preserved and the original physically implemented circuit design may be used as the final netlist.

Figure 4:
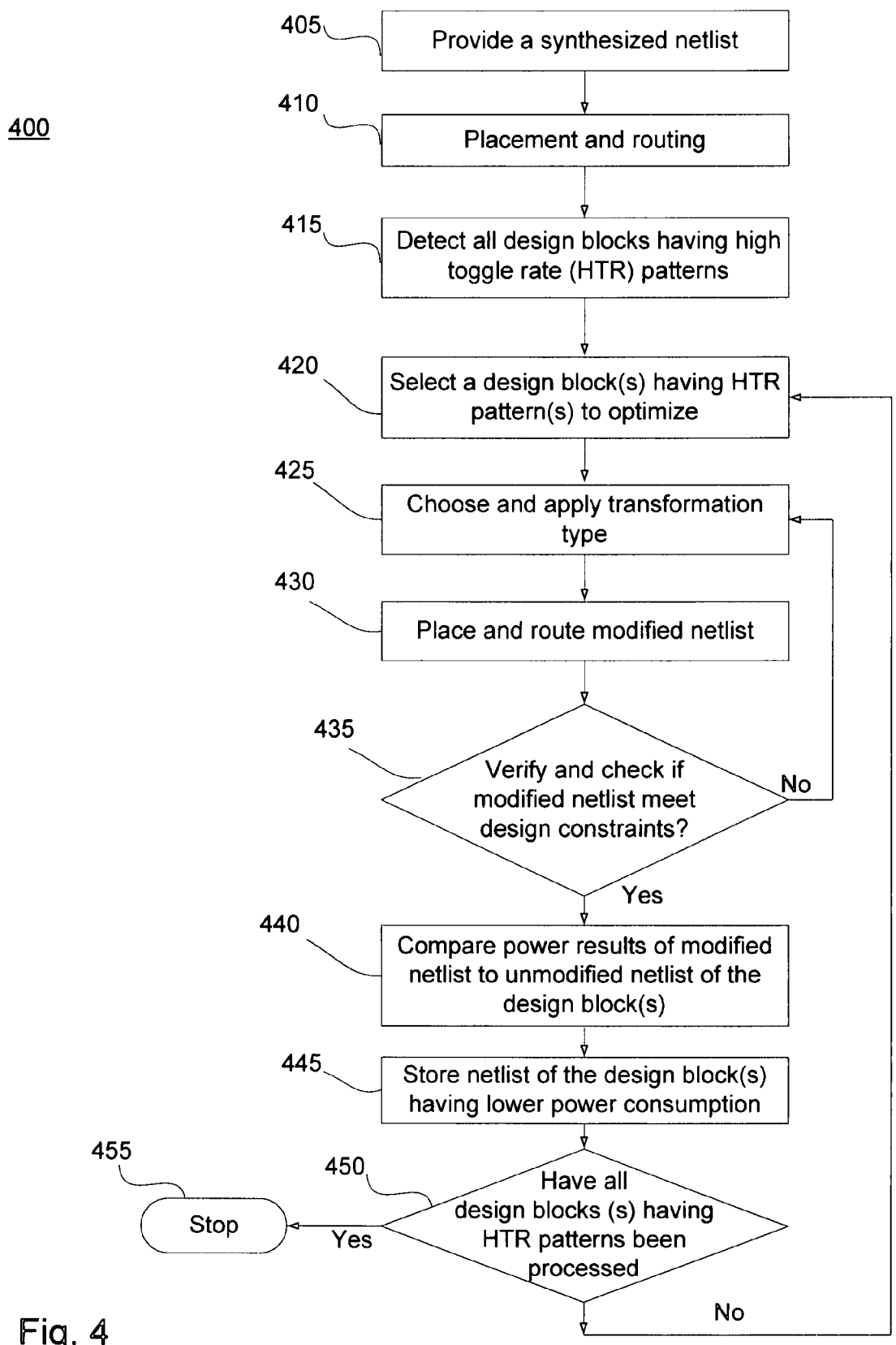
FIG. 4 is a flow diagram illustrating another method steps for providing a physically implemented circuit design according to an embodiment of the present invention.

FIG. 4 is a flow diagram illustrating another method steps for providing a physically implemented circuit design according to an embodiment of the present invention. The method illustrated in FIG. 4 can be appreciated by persons skilled in the art as an example for implementing a physically implemented circuit design using a PLD. The method describes steps to modify a physically implemented circuit design meeting a design constraint to include an additional performance enhancement, such as power optimization. The first two steps of the method illustrated in FIG. 4 (steps 405 and 410) are similar to the first two steps shown and described in FIG. 3 (steps 305 and 310). Steps 405-410 describe providing a physically implemented circuit design meeting performance criteria or a design constraint.

At step 415, all design blocks having HTR patterns that qualify for power optimization may be detected. The detected design blocks of step 415 may be modified individually or in parallel. A person skilled in the art can make such determination. At step 420, a design block having HTR patterns may be selected. For instance, a designer may elect a criterion to qualify a design block having a HTR pattern for optimization. One option may be a percentage improvement in power optimization. At step 420 the selection process may include an individual design block or a group of design blocks. The group selection may include numerous design blocks having HTR patterns. At step 425 a power optimization transformation type is chosen and applied to the selected design block having an HTR pattern. In one example, the transformation type may be applied to a design block or a group of design blocks. At step 430 the optimized (or modified) design block is placed and routed. For instance, the PAR tool 214 of FIG. 2 may be used to perform the placing and routing procedure. In an example, the applied transformation type may only rearrange a signal having high switching activity. In another example, achieving the power optimization may require rearrangement of circuits of the design block. In general, minimizing power consumption of a circuit design may include reducing the load capacitance, and/or reducing the frequency and/or reducing the supply voltage. At step 430 the placed and routed circuit design netlist may be provided (i.e., the modified physically implemented circuit design optimized for power).

At step 435, the modified physically implemented and power optimized circuit design is verified against performance criteria (e.g., a design constraint or a timing constraint). If the modified power optimized circuit design meets the design constraint, then power results of the modified physically implemented circuit design netlist may be compared to power results of the circuit designs detected in step 415 (step 440). Otherwise, If the modified circuit design netlist does not meet the design constraint, then another transformation type is chosen and applied (step 425) to the circuit design netlists detected in step 415. In one example, the actual measured power results are used to compare the modified version of the circuit design to a previous version of the circuit design. At step 445 the netlist belonging to the physically implemented circuit design with the least power consumption may be stored.

At step 450, if all the detected design blocks having HTR patterns been processed, then stop (step 455). Otherwise, if an additional design block has not been processed, then another design block may be selected (step 420). If the modified design block does not meet a design constraint, then the physically implemented netlist associated with the modified circuit design may be ignored and another transformation type may be chosen and applied (step 425). Steps 420-450 may be repeated until all the design blocks have been transformed and verified to meet the design constraint. At step 420 when all the detected design blocks have been modified and/or verified for performance criteria, then the modified physically implemented netlist is complete and the loop may terminate at step 455. In another example, the original physically implemented netlist may not be modified. In such scenario, the original physically implemented netlist may be the most optimized solution for the implemented circuit design. In such instances, the original physically implemented circuit design may be used as the final circuit design netlist.

Figure 5:
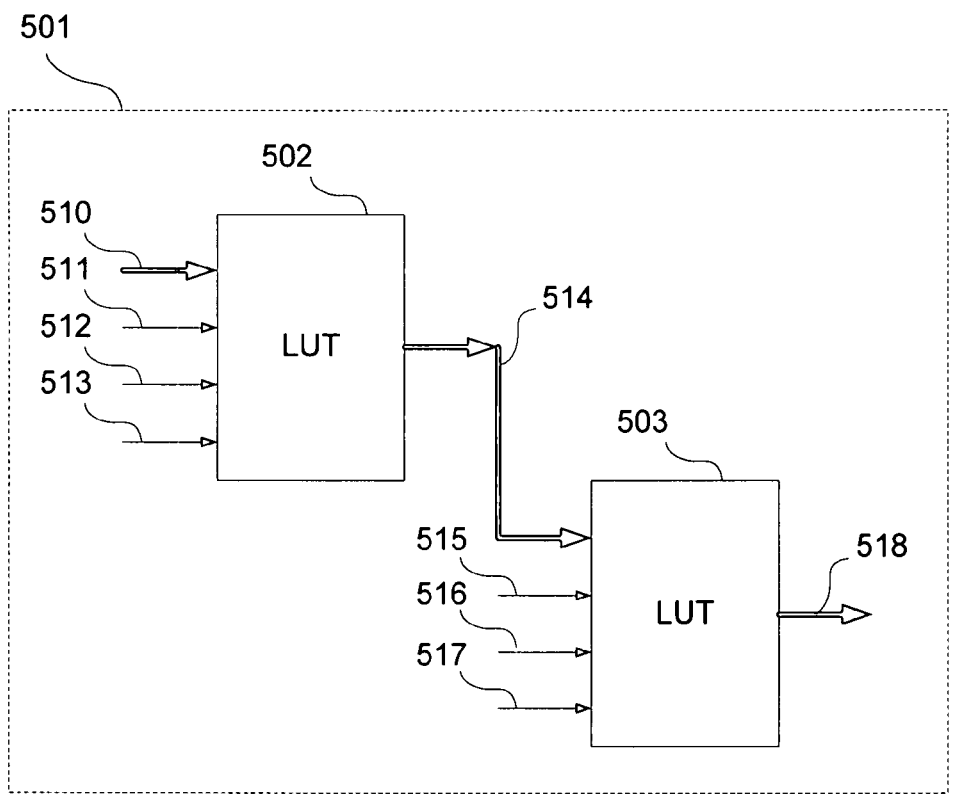
FIG. 5 is a block diagram graphically illustrating rearranging signals of a physically implemented circuit design according to an embodiment of the present invention.
Figure 5:
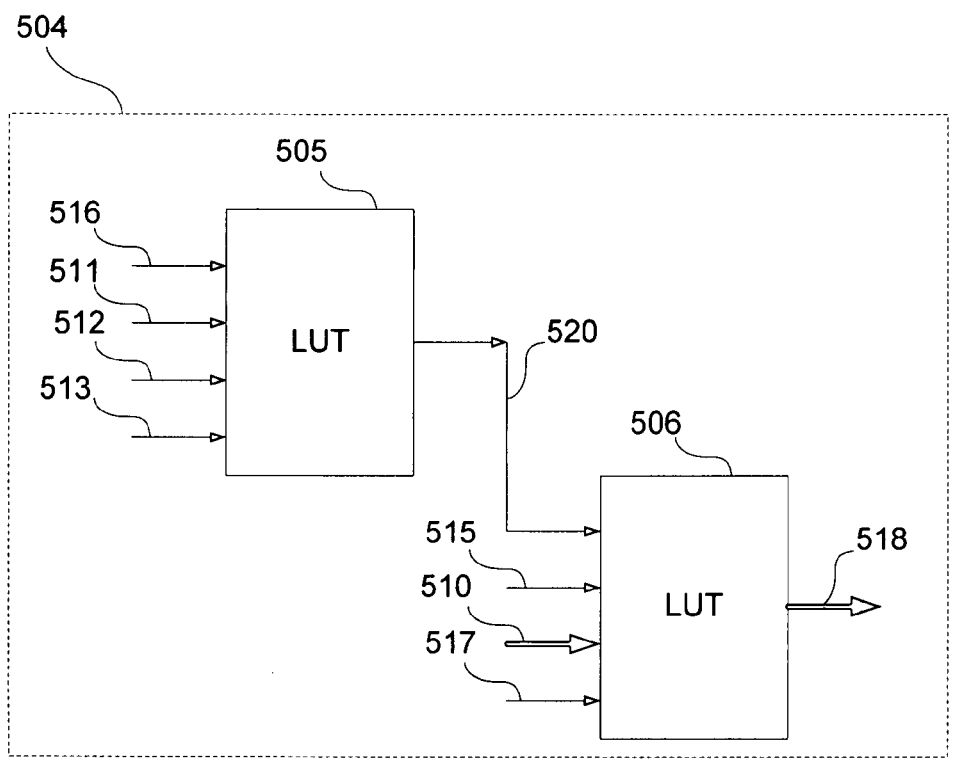

FIG. 5 is a simplified design block graphically illustrating an original and a modified design block according to an embodiment of the present invention. Circuit 501 may represent an original design block, while circuit 504 may represent a modified design block. A power optimization transformation type may be applied to circuit 501 generating circuit 504. The power optimization transformation type is implemented by rearranging a HTR signal. The block diagrams illustrated in FIG. 5 include two design blocks 501 and 504 each including LUT circuits of an FPGA. In general, a LUT circuit may be viewed as a select circuit having numerous input signals, control signals, and an output. The LUT circuits may be utilized as building blocks of a circuit design of an FPGA. In an example, circuit 501 may include LUT circuits 502-503, and circuit 504 may include LUT circuits 505-506. Circuit 501 and circuit 504 may have the same function and performance, but circuit 504 may be optimized for power (circuit 504 consumes less power).

LUT circuit 502 is coupled to receive signals 510-513 and may provide signal 514, and LUT circuit 503 is coupled to receive signals 514-517 and provide signal 518 (output of circuit 501). In one example, signal 510 may be a HTR signal. The HTR attribute can be described as a signal having high switching rate or frequency, such as a clock signal or a signal having switching activity higher than any other signals of a design. Since signal 510 is detected having HTR, all logic gates coupled to signal 510 and signals derived from signal 510 (such as signal 514) may have HTR as well. In general, power consumption increases proportionally to the switching activity (toggle rate) of a given design, the provided frequency, the capacitive load, and to the square value of the supply voltage. This relationship may be illustrated in the given formula $P=SC_LV^2F$, where P is the power dissipation of a design, S is the switching activity, $C_L$ is the capacitive load, V is the supply voltage, and F is the operating frequency. The switching activity parameter "S" is a measure of the toggle rate of a node in per clock cycle or a number of clock cycles. The "S" parameter may be used to detect a circuit design having nodes with HTR that may be candidates for power optimization. For instance, the power consumption P of a design may be reduced by decreasing one or more of the S, $C_L$, V, F parameters. In an example, when a physically implemented design is provided, the frequency and voltage generally are fixed parameters. Therefore, decreasing the power consumption in such scenario may depend on reducing the switching rate "S" and/or reducing the load capacitance $C_L$. The circuits illustrated in FIG. 5 address reducing the power consumption by reducing the switching rate of a design. Reducing the capacitive load $C_L$ will be described later in an alternate embodiment.

Circuit 504 is an example of a circuit optimized for power and having the same functionality as circuit 501. Circuit 504 may also be referred to as a power optimized physically implemented circuit design. Circuit 504 may have lower power consumption due to a reduced number of gates toggling at a high rate. LUT circuit 505 is coupled to receive signals 511-513, 516 and provides signal 520. LUT circuit 506 is coupled to receive signals 510, 515, 517, and 520 and provides signal 518. Signal 510 is a HTR signal coupled to LUT circuit 506 to achieve the lower switching activity (lower S parameter), therefore lower power consumption. The lower power consumption is attained by reducing the number of gates coupled to signal 510 of circuit 504. Therefore, circuit 504 may consume less power that circuit 501.

FIG. 5 illustrates a simplified example of a circuit including two LUT circuits (501 and 504) coupled to perform the same function. The above described methodology concerning the reduction of power consumption may be applied to an integrated circuit having numerous having numerous circuit designs. Also, for better understanding of the example shown in FIG. 5, we illustrated that only signal 510 has high toggle rate. Other circuit designs may require additional signals to be moved or reassigned in order to maintain circuit functionality and/or performance.

Figure 6:
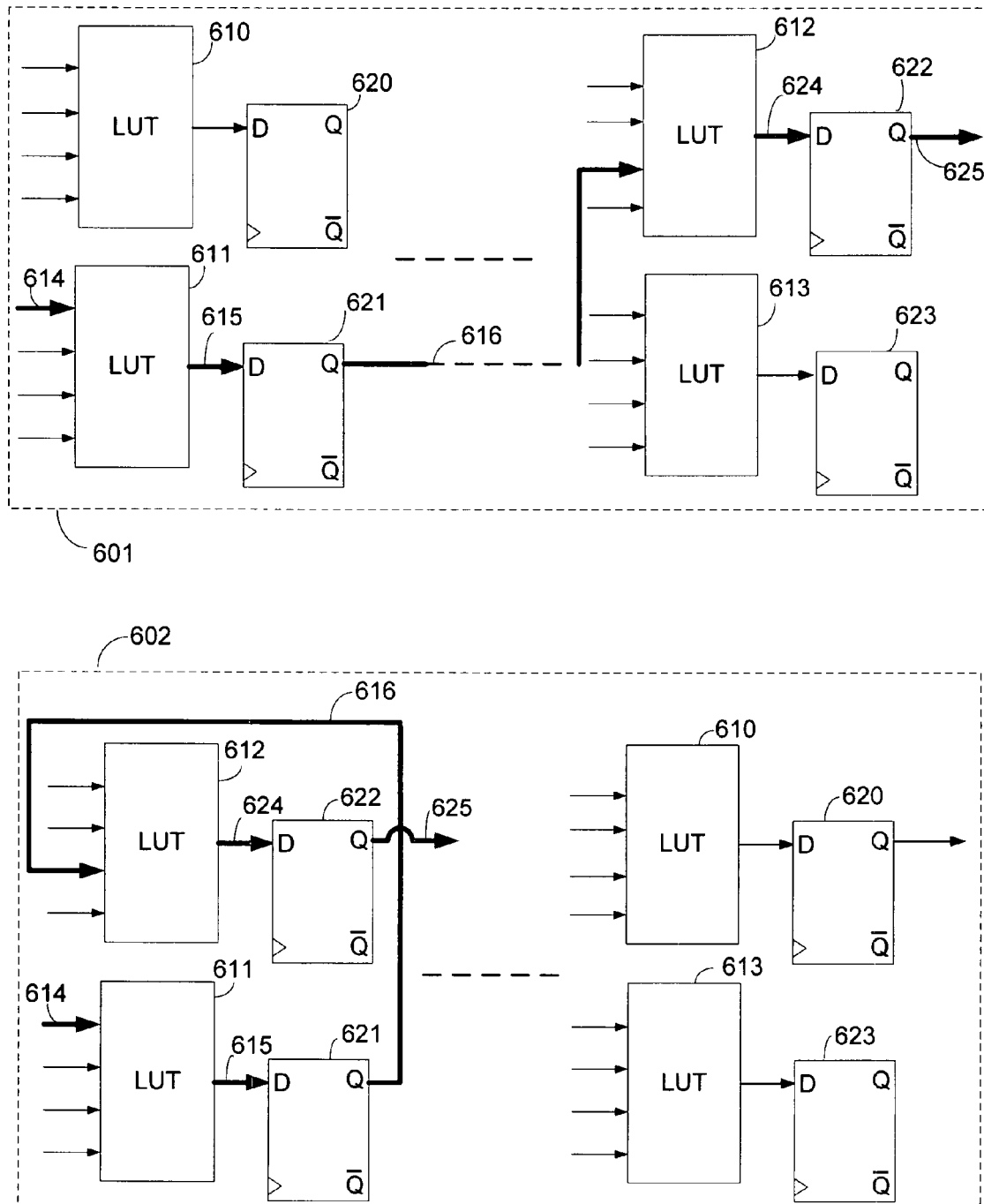
FIG. 6 is a block diagram graphically illustrating rearranging design blocks of a physically implemented circuit design according to an embodiment of the present invention.

FIG. 6 is a simplified design block graphically illustrating an original and a modified design block according to an embodiment of the present invention. Circuit design 602 is a modified version of a physically implemented circuit design 601, where circuit 602 may be power optimized. Circuits 601 and 602 may include the same resources, functionality, and performance. A power transformation type is applied to circuit 601 providing circuit 602, where design blocks of circuit 602 may be rearranged to achieve the power optimization.

Circuits 601 and 602 may include LUT circuits 610-613, and FFs (D type flip flops) 620-623 coupled in the manner shown in FIG. 6. In an example, signal 614 may be a HTR signal, and it is coupled to an input of LUT circuit 611 (of circuit 601). LUT circuit 611 may provide signal 615 in response to input signals, including signal 614. For instance, signal 615 may be a HTR signal generated from signal 614. Signal 616 (an output of the D-FF 621) is also a HTR signal since it is provided in response to signal 615. Signal 616 (of circuit 601) is coupled to LUT circuit 612, where the route of signal 616 may be a long route. In general, long routes have higher loads (capacitive and resistive) associated with them. In general the load (capacitive and resistive) is proportional to the length of the route. Circuits providing signals to drive bigger loads may require larger signal driver (e.g., more current) to maintain signal performance. Therefore, a circuit driving a big load has higher power consumption. Optimizing for power consumption and maintaining or improving performance of circuit design may require reducing the distance between circuits that are coupled to each other (i.e., reducing the route lengths). A person skilled in the art may make a determination in addressing the criterion for signals having long routes.

Signal 616 (of circuit 601) may be determined to have a long route (i.e., high load that meets optimization criterion). As mentioned earlier, power may be given by the formula $P=SC_L V^2 F$. Therefore, more power is needed to drive signal 616 due to the high load (high $C_L$) of the long route propagating signal 616. Circuit 602 illustrates a method to reduce power consumption by rearranging LUT circuits of an FPGA to minimized (or reduce) a route length. In another example, a long route may also provide a HTR signal (e.g., the route propagating signal 616 of circuit 601). For instance, circuit 602 illustrates LUT circuit 612 placed in close proximity to D-FF 621. Therefore, signal 616 may have a shorter distance (i.e., minimized route length). In doing so, signal 616 of circuit 602 may require less drive strength (i.e., less power) to be provided to an input of LUT 612 (of circuit 602).

The steps described above may be applied to a circuit design including numerous logic gates (e.g., LUT circuits of an FPGA) and numerous HTR signals. The power optimization may be proportional the number of power optimized nodes and/or routes. There are many methods available for choosing and/or prioritizing the power optimization of the circuit design, such as design blocks having the highest toggle rate and/or design blocks having longest routes. Other methods are well known to persons skilled in the art. The main objective is to maintain the functionality and the performance of circuit 601 while applying an optimization transformation type that may reduce power consumption. Reconfiguring the LUT circuits of a circuit design may reduce the power consumption without affecting functionality and performance. The design block of circuit 602 shown in FIG. 6 is a simplified example of a power optimized design provided by applying an optimization transformation type to a selected design (e.g., circuit 601).

Figure 7:
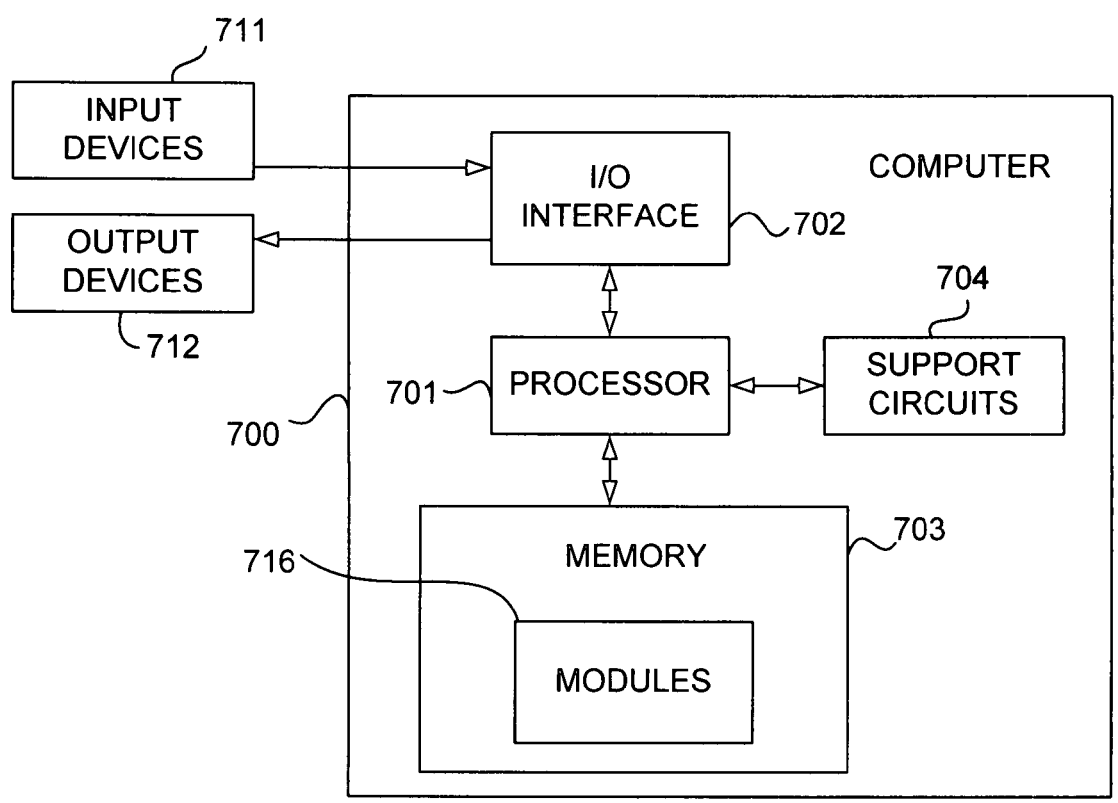
FIG. 7 is a block diagram illustrating a computer suitable for implementing processes and methods according to an embodiment of the present invention.

FIG. 7 is a block diagram illustrating a computer suitable for implementing the processes and methods according to an embodiment of the present invention. For example, the computer 700 may be used to implement the system 200 of FIG. 2, as well as the methods 300 and 400 of FIGS. 3 and 4. The computer 700 includes a processor 701, a memory 703, various support circuits 704, and an I/O interface 702. The processor 701 may include one or more microprocessors well known to persons skilled in the art. The support circuits 704 for the processor 701 may include conventional cache, power supplies, clock circuits, data registers, I/O interfaces, and the like. The I/O interface 702 may be directly coupled to the memory 703 or coupled through the processor 701. The I/O interface 702 may also be configured for communication with input devices 711 and/or output devices 712, such as, network devices, various storage devices, mouse, keyboard, display, and the like.

The memory 703 stores processor-executable instructions and/or data that may be executed by and/or used by the processor 701. These processor-executable instructions may comprise hardware, firmware, software, and the like, or some combination thereof. The memory 703 may store modules 716 for implementing the design system 200 and/or the processes 300 and 400 of the FIGS. 2-4 respectively. The computer 700 may be programmed with an operating system, which may include OS/2, Java Virtual Machine, Linux, Solaris, Unix, HPUX, AIX, Windows, Windows95, Windows98, Windows NT, and Windows2000, WindowsME, WindowsXP, Windows Server, Windows Vista among other known platforms. At least a portion of the operating system may be disposed in the memory 703. The memory 703 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Programs of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for implementing a circuit design for an integrated circuit, comprising:
   providing a physically implemented circuit design meeting at least one timing constraint;
   identifying a design block of the physically implemented circuit design having a high toggle rate pattern;
   selecting a particular power optimized transformation type of a plurality of power optimized transformation types;
   applying the particular power optimized transformation type to the design block of the physically implemented circuit design having the high toggle rate pattern;
   implementing a modified physically implemented circuit design after application of the particular power optimized transformation type, wherein the modified physically implemented circuit design is power optimized;
   determining whether or not the modified physically implemented circuit design meets the at least one timing constraint;
   measuring actual power consumption of the modified physically implemented circuit design;
   comparing the actual power consumption of the modified physically implemented circuit design to power consumption of the physically implemented circuit design;
   in response to the modified physically implemented circuit design not meeting the at least one timing constraint, selecting another of the plurality of power optimized transformation types as the particular power optimized transformation type, and repeating the steps of applying, implementing, determining and selecting another; and
   in response to the modified physically implemented circuit design meeting the at least one timing constraint and the actual power consumption of the modified physically implemented circuit design being less than the power consumption of the physically implemented circuit design, storing the modified physically implemented circuit design in a processor-readable storage device, wherein the plurality of power optimized transformation types includes at least a first transformation type that rearranges a signal having high switching activity and a second transformation type that rearranges circuits of the design block.

2. The method of claim 1, wherein the second transformation type reduces a number of gates toggling at a high rate.

3. The method of claim 1, wherein the first transformation type shortens a signal path for a high toggle rate signal.

4. A non-transitory computer readable medium having stored thereon instructions that, when executed by a processor, cause the processor to perform a method for implementing a power optimized circuit design of an integrated circuit, the method comprising:
   detecting high toggle rate patterns in a physically implemented design having a plurality of design blocks;
   selecting a particular power optimization transformation type of a plurality of power optimization transformation type;
   applying the particular power optimization transformation type to at least one design block of the physically implemented design having one of the high toggle rate patterns;
   implementing a placement of a modified version of the at least one design block of the physically implemented design after application of the particular power optimization transformation type;
   determining whether or not the modified version of the at least one design block of the physically implemented design meets at least one timing constraint;
   measuring actual power consumption of the modified physically implemented circuit design;
   comparing the actual power consumption of the modified physically implemented circuit design to power consumption of the physically implemented circuit design;
   in response to the at least one timing constraint not being met, selecting another of the plurality of power optimized transformation types as the particular power optimized transformation type, and repeating the steps of applying, implementing, determining and selecting another of the plurality of power optimized transformation types; and
   in response to the at least one timing constraint being met and the actual power consumption of the modified physically implemented circuit design being less than the power consumption of the physically implemented circuit design, storing the modified physically implemented circuit design with the modified version of the at least one design block in a processor-readable storage device, wherein the plurality of power optimized transformation types includes at least a first transformation type that rearranges a signal having high switching activity and a second transformation type that rearranges circuits of the design block.

5. The non-transitory computer readable medium of claim 4, wherein the second transformation type reduces a number of gates toggling at a high rate, and the first transformation type shortens a signal path for a high toggle rate signal.

6. A system for providing a power optimized physically implemented design, comprising:
   a processor;
   a memory coupled to the processor, wherein the memory is configured with instructions that when executed by the processor cause the processor to perform the operations including:
      providing a physically implemented circuit design meeting at least one timing constraint;

identifying a design block of the physically implemented circuit design having a high toggle rate pattern;

selecting a particular power optimized transformation type of a plurality of power optimized transformation types;

applying the particular power optimized transformation type to the design block of the physically implemented circuit design having the high toggle rate pattern;

implementing a modified physically implemented circuit design after application of the particular power optimized transformation type, wherein the modified physically implemented circuit design is power optimized;

determining whether or not the modified physically implemented circuit design meets the at least one timing constraint;

measuring actual power consumption of the modified physically implemented circuit design;

comparing the actual power consumption of the modified physically implemented circuit design to power consumption of the physically implemented circuit design;

in response to the modified physically implemented circuit design not meeting the at least one timing constraint, selecting another of the plurality of power optimized transformation types as the particular power optimized transformation type, and repeating the steps of applying, implementing, determining and selecting another; and in response to the modified physically implemented circuit design meeting the at least one timing constraint and the actual power consumption of the modified physically implemented circuit design being less than the power consumption of the physically implemented circuit design, storing the modified physically implemented circuit design in a processor-readable storage device, wherein the plurality of power optimized transformation types includes at least a first transformation type that rearranges a signal having high switching activity and a second transformation type that rearranges circuits of the design block.

7. The system of claim 6, wherein the second transformation type reduces a number of gates toggling at a high rate.

8. The system of claim 6, wherein the first transformation type shortens a signal path for a high toggle rate signal.

* * * * *